(12) United States Patent
Tang et al.

(10) Patent No.: US 8,753,899 B2
(45) Date of Patent: Jun. 17, 2014

(54) MAGNETORESISTIVE RANDOM ACCESS MEMORY (MRAM) DEVICE AND FABRICATION METHODS THEREOF

(75) Inventors: Bang-Tai Tang, New Taipei (TW); Cheng-Yuan Tsai, Chu-Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/215,389

(22) Filed: Aug. 23, 2011

(65) Prior Publication Data

US 2013/0049144 A1  Feb. 28, 2013

(51) Int. Cl.
| | |
|---|---|
| *H01L 41/20* | (2006.01) |
| *H01L 41/06* | (2006.01) |
| *G11B 5/39* | (2006.01) |
| *H01L 21/285* | (2006.01) |
| *H01L 21/64* | (2006.01) |
| *H01L 29/88* | (2006.01) |

(52) U.S. Cl.
USPC ............ 438/3; 438/593; 438/768; 427/130; 360/324.2

(58) Field of Classification Search
None
See application file for complete search history.

(56) References Cited

U.S. PATENT DOCUMENTS

| | | | |
|---|---|---|---|
| 2007/0263327 A1* | 11/2007 | Lee et al. .................. | 360/324.1 |
| 2010/0079551 A1* | 4/2010 | Saito et al. ................ | 347/64 |
| 2010/0289098 A1* | 11/2010 | Li et al. .................... | 257/421 |

FOREIGN PATENT DOCUMENTS

JP  2007-242663  9/2007

* cited by examiner

*Primary Examiner* — Michael Trinh
*Assistant Examiner* — Pamela E Perkins
(74) *Attorney, Agent, or Firm* — Lowe Hauptman & Ham, LLP

(57) ABSTRACT

A method includes patterning a plurality of magnetic tunnel junction (MTJ) layers to form an MTJ cell, and forming a dielectric cap layer over a top surface and on a sidewall of the MTJ cell. The step of patterning and the step of forming the dielectric cap layer are in-situ formed in a same vacuum environment. A plasma treatment is performed on the dielectric cap layer to transform the dielectric cap layer into a treated dielectric cap layer, whereby the treated dielectric cap layer improves protection from $H_2O$ or $O_2$, and thus degradation.

20 Claims, 9 Drawing Sheets

MAGNETORESISTIVE RANDOM ACCESS MEMORY (MRAM) DEVICE AND FABRICATION METHODS THEREOF

BACKGROUND

Semiconductor storage devices are used in integrated circuits for electronic applications, including radios, televisions, cell phones, and personal computing devices. Storage devices include charge-storing devices such as dynamic random access memories (DRAMs) and flash memories.

A more recent development in storage devices involves spin electronics, which combine semiconductor technology and magnetic materials. The spin polarization of electrons, rather than the charge of the electrons, is used to indicate the state of "1" or "0." One type of semiconductor memory device is magnetoresistive random access memory (MRAM), which involves spin electronics that combines semiconductor technology and magnetic materials and devices. The spins of electrons, through their magnetic moments, rather than the charge of the electrons, are used to indicate bit values.

A typical MRAM cell may include a magnetic tunnel junction (MTJ) device, which generally includes a free layer, a pinned layer, and a tunnel layer interposed between the free layer and the pinned layer. The magnetization direction of the free layer can be reversed by applying a current through the tunnel layer, which causes the injected polarized electrons within the free layer to exert spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer, flowing through the tunnel layer, and then into and accumulating in the free layer. Eventually, the magnetization of the free layer is parallel to that of the pinned layer, and the MTJ device will be at a low resistance state. The electron injection caused by current is referred to as a major injection.

When current flowing from the pinned layer to the free layer is applied, electrons flow in the direction from the free layer to the pinned layer. The electrons having the same polarization direction as the magnetization direction of the pinned layer are able to flow through the tunnel layer and into the pinned layer. Conversely, electrons with a polarization differing from the magnetization of the pinned layer will be reflected (blocked) by the pinned layer, and will accumulate in the free layer. Eventually, magnetization of the free layer becomes anti-parallel to that of the pinned layer, and the MTJ device will be at a high-resistance state. The respective electron injection caused by current is referred to as a minor injection.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A magnetoresistive random access memory (MRAM) device and the method of forming the same are provided in accordance with various embodiments. The intermediate stages of forming a magnetic tunnel junction (MTJ) cell and the overlying structure are illustrated. Variations of the embodiments are discussed. Throughout the various views and illustrative embodiments, like reference numbers are used to designate like elements.

Figure 1:
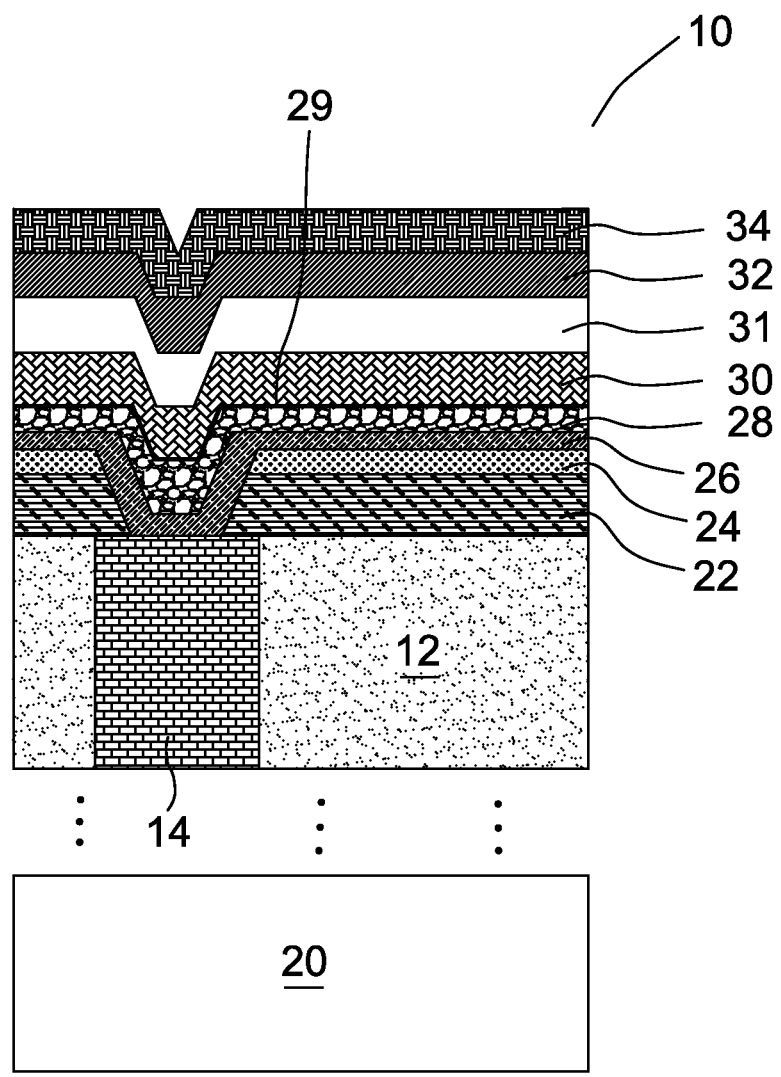
FIGS. 1 through 8 are cross-sectional views of intermediate stages in the manufacturing of a magnetoresistive random access memory (MRAM) device in accordance with various embodiments.

Referring to FIG. 1, a MRAM device 10, which includes a substrate 20, is provided. The substrate 20 may be formed of commonly known semiconductor materials, such as silicon, silicon germanium, silicon carbon, or the like. In an embodiment, the substrate 20 is a bulk silicon substrate. In FIGS. 3 through 8, the substrate 20 is not shown, although the substrate 20 is also located under the structures shown in FIGS. 3 through 8. A dielectric layer 12 is formed over the substrate 20. In an embodiment, the dielectric layer 12 is a low-k dielectric layer having a k value smaller than about 3.0 or lower than about 2.5. A metal feature 14, which may be formed of copper or a copper alloy, is formed in the dielectric layer 12. A dielectric layer 22 is formed over the dielectric layer 12. In an embodiment, the dielectric layer 22 comprises a silicon carbide.

An insulation layer 24, a bottom electrode layer 26, and an MTJ structure 28 are formed over the dielectric layer 22, for example, using chemical vapor deposition (CVD) methods. The insulation layer 24 may be formed of silicon nitride, silicon oxide, silicon oxynitride, or other dielectric materials. The bottom electrode layer 26 is formed of a conductive material, such as a metal or a metal alloy. In an embodiment, the bottom electrode layer 26 is formed of tantalum or a tantalum alloy. The bottom electrode layer 26 is electrically coupled to the metal feature 14.

Figure 2:
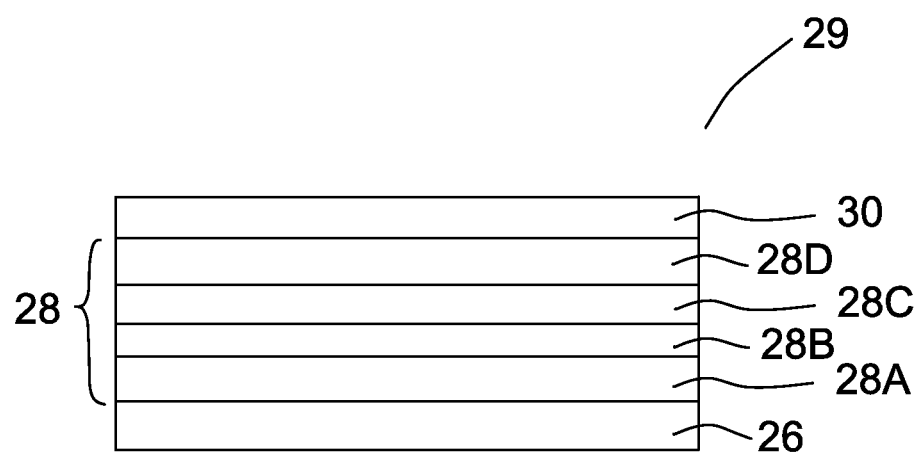

The MTJ structure 28 may include various layers. FIG. 2 illustrates a magnified view of a portion of the structure shown in FIG. 1, wherein the illustrated portion is retrieved from a region 29 as shown in FIG. 1. In an exemplary embodiment, as shown in FIG. 2, the MTJ structure 28 includes a pinning layer 28A, a pinned layer 28B over the pinning layer 28A, a tunnel barrier layer 28C over the pinned layer 28B, and a free layer 28D over the tunnel barrier layer 28C. The neighboring layers in layers 28A, 28B, 28C, and 28D may also be in physical contact with each other. In addition, the MTJ structure 28 may have other variations. In an exemplary embodiment, the pinning layer 28A is formed of PtMn, the pinned layer 28B is formed of CoFe or CoFeB, the tunnel barrier layer 28C is formed of MgO, and the free layer 28D is formed of CoFeB. The magnetic moment of free layer 28D may be programmed, and the resistance of the resulting MTJ structure 28 is accordingly changed between a high resistance and a low resistance. It is realized that the materials and the structure of MTJ structure 28 may have many variations, which are also within the scope of the present disclosure. For example, the MTJ structure 28 may further include additional layers, such as anti-ferro-magnetic layers (not shown). The layers 28A through 28D may also be formed in an inverse order from what is shown in FIG. 2. Accordingly, the free layer 28D may be the bottom layer in the MTJ structure 28, while pinning layer 28A may be the top layer in the MTJ structure 28.

Referring back to FIG. 1, a top electrode layer 30 is formed over the MTJ structure 28. In an embodiment, the top electrode layer 30 is formed of tantalum, tantalum alloy, or other metallic materials. A plurality of features is formed over the top electrode layer 30, wherein the plurality of features is used for the patterning of the top electrode layer 30 and the MTJ structure 28. In an embodiment, the plurality of features includes an amorphous carbon (APF) feature 31, a hard mask feature 32 (which may be formed of silicon oxide, for example), and a bottom anti-reflective coating (BARC) feature 34 (which may be formed of silicon oxynitride). In alternative embodiments, the plurality of features may include different combinations of layers.

Figure 3:
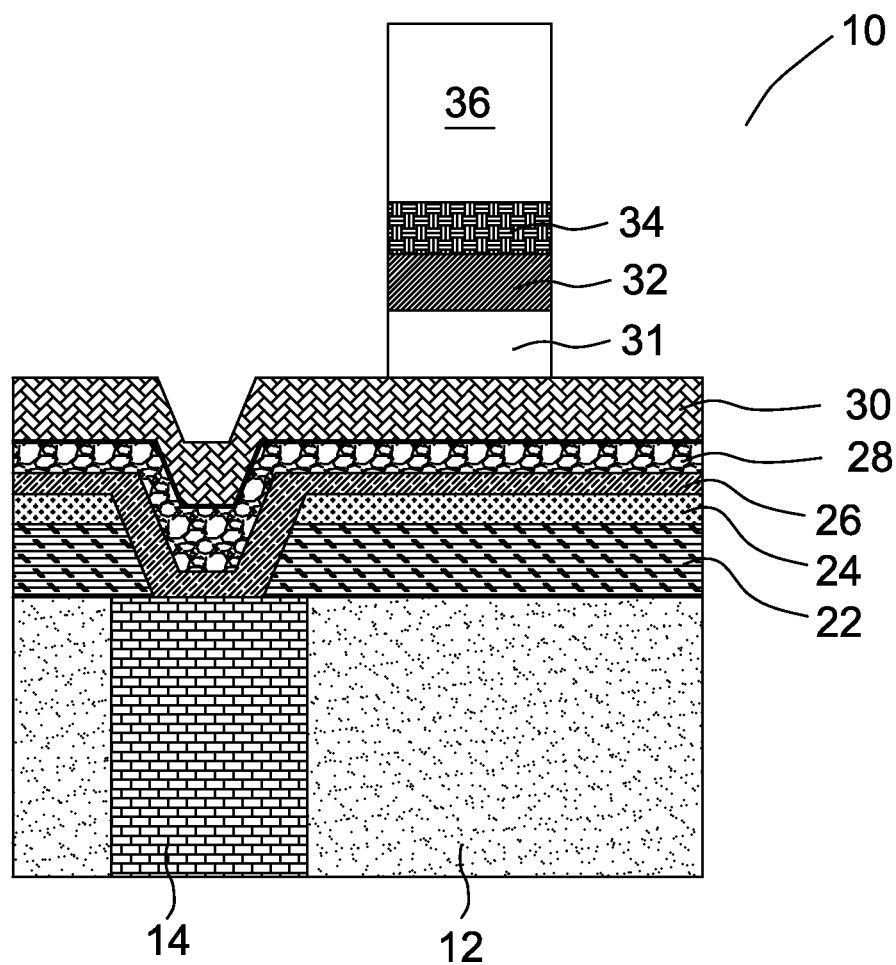

Referring to FIG. 3, a photoresist feature 36 is provided in order to pattern the MTJ structure 28 to define an MTJ cell. In embodiments, the photoresist feature 36 is formed by providing a photoresist layer (not shown). The photoresist feature 36 is then patterned by photo exposure and developing processes. It is realized that although only one part of the photoresist feature 36 is illustrated, there may be an array of the patterned photo resist components, which are for forming an MTJ cell array. Subsequently, the pattern of the photoresist feature 36 is transferred to the underlying BARC layer (not shown), hard mask layer (not shown), and APF layer (not shown) by an etching process using the photoresist feature 36 as a mask to form the BARC feature 34, the hard mask feature 32, and the APF feature 31 as shown in FIG. 3.

Figure 4:
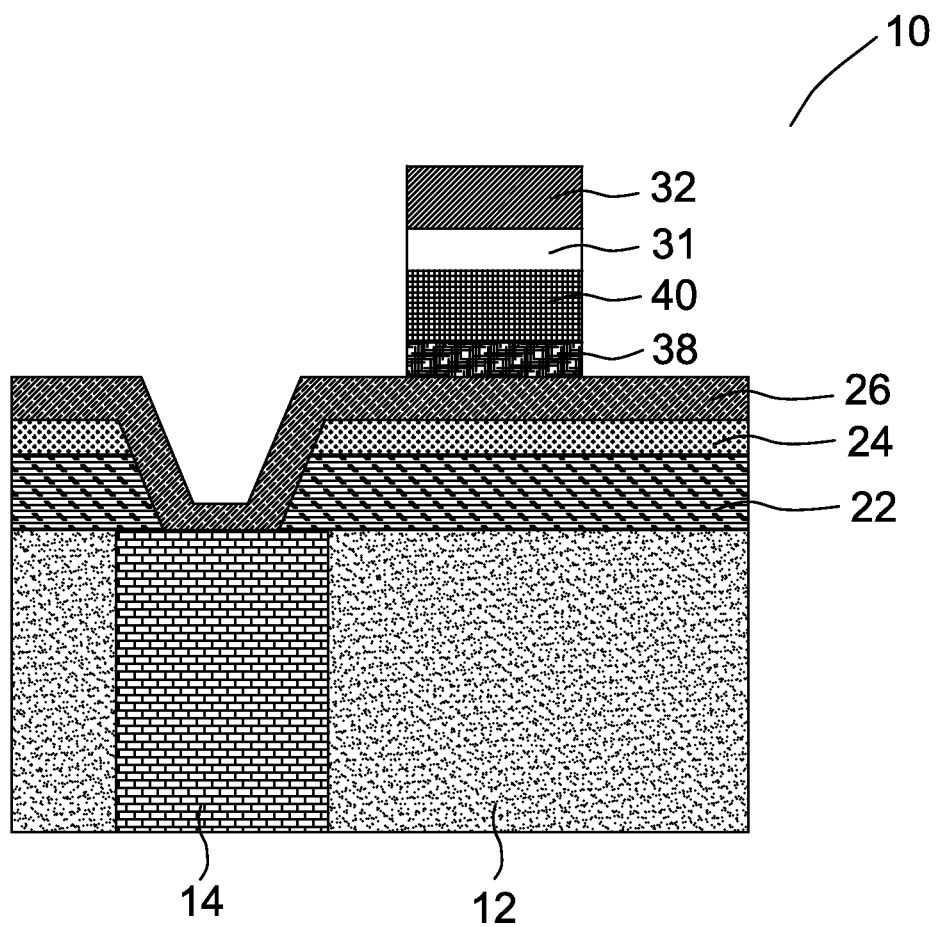

Referring to FIG. 4, the MTJ structure 28 and the top electrode layer 30 are patterned by etching processes using the photoresist feature 36 and/or the BARC feature 34 as a mask. The resulting parts of patterning MTJ structure 28 and the top electrode layer 30 are referred to as an MTJ cell 38 and a top electrode 40, respectively. The photoresist feature 36 and the BARC feature 34 are then removed by a stripping and/or etching process after forming the MTJ cell 38 and the top electrode 40.

Figure 5:
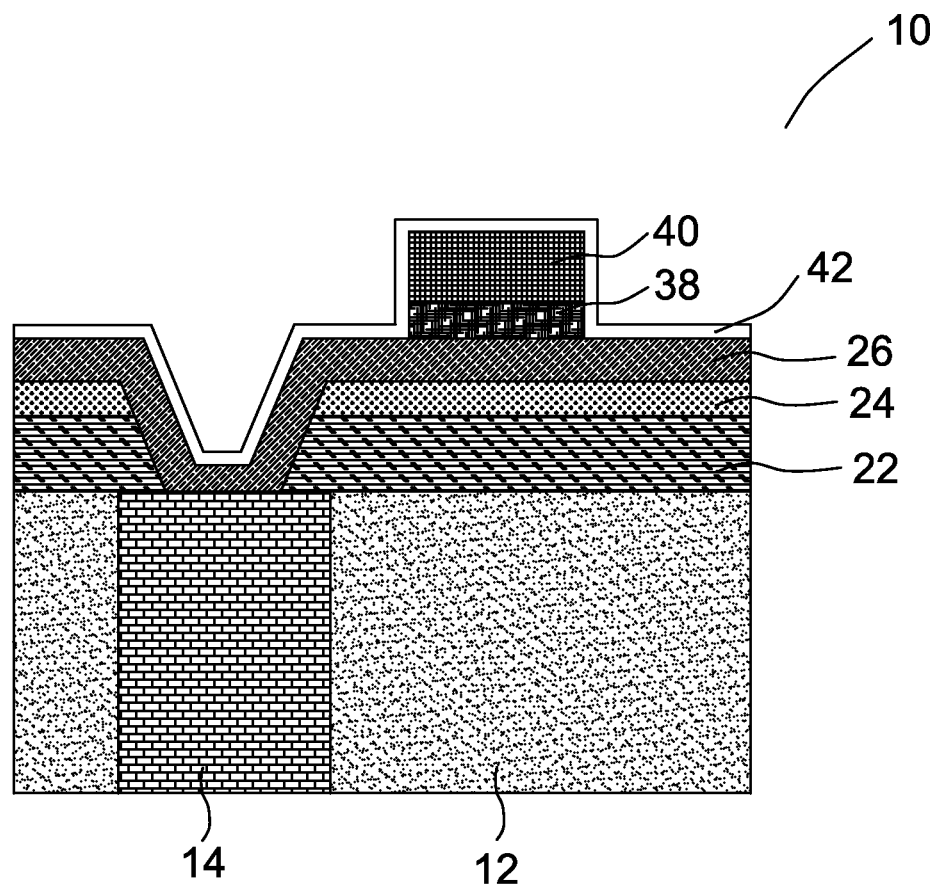

Next, the hard mask feature 32 and the APF feature 31 are removed by, for example, etching processes, and the resulting structure is shown in FIG. 5. FIG. 5 also illustrates the formation of a dielectric cap layer 42. In embodiments, the dielectric cap layer 42 extends on, and is in physical contact with, the sidewalls and the top surface of top electrode 40, and is in physical contact with the sidewalls of MTJ cell 38. In an embodiment, the dielectric cap layer 42 is formed of silicon nitride (SiN), although it may also be formed other dielectric materials. The forming method of dielectric cap layer 42 may include radical shower chemical vapor deposition (RSCVD) or other non-plasma generating CVD methods. In embodiments, the dielectric cap layer 42 is formed by RSCVD with a low deposition rate, e.g., not greater than about 4.5 Å/sec, whereby the dielectric cap layer 42 can achieve a relatively high density (e.g., greater than about 2.4 g/cm$^3$). In embodiments, the dielectric cap layer 42 is formed with a deposition rate ranging between about 2.0 Å/sec and about 4.5 Å/sec. In embodiments, the dielectric cap layer 42 is formed at a temperature ranging between about 200° C. and about 300° C. In embodiments, the dielectric cap layer 42 is formed using chemicals comprising $SiH_4$ and $NH_3$ gases. In an alternative embodiment, Ar is mixed with $SiH_4$ and $NH_3$ gases for forming the dielectric cap layer 42. The flow rates of the $SiH_4$ and $NH_3$ gases, for example, are ranging from about 20 sccm to about 45 sccm and from about 1000 sccm to about 2000 sccm, respectively. In embodiments, the dielectric cap layer 42 is formed under a pressure ranging between about 10 mTorr and about 30 mTorr, using a power ranging between about 1000 watts and about 2000 watts. The thickness of dielectric cap layer 42 may be between about 30 Å and about 150 Å, for example.

Figure 9:
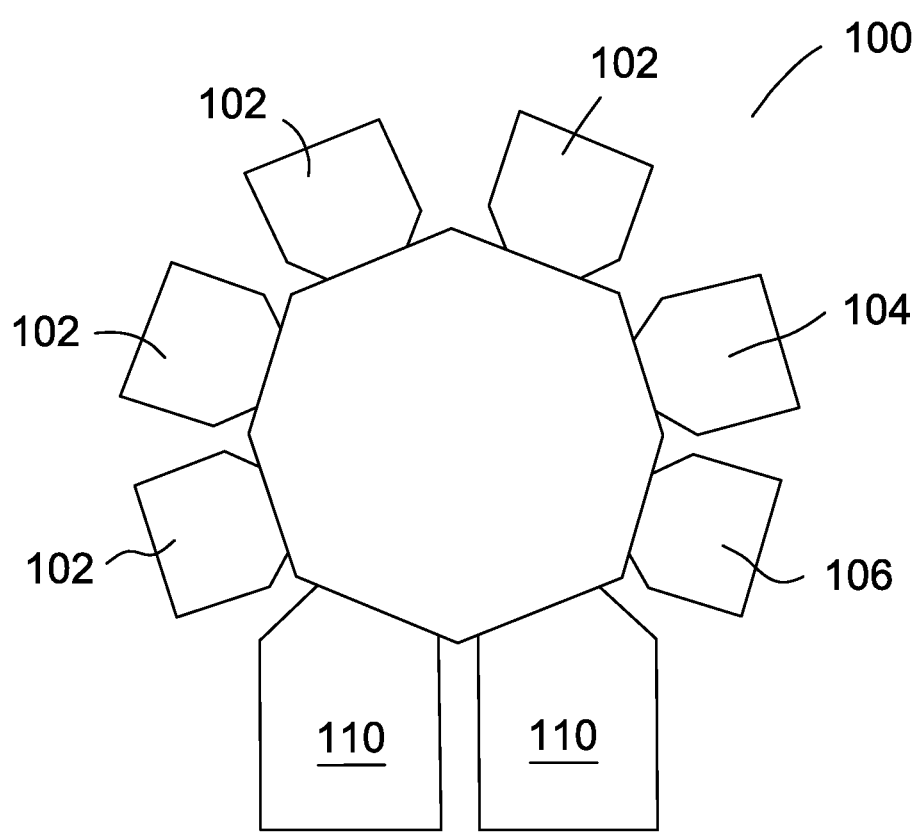
FIG. 9 illustrates a production tool for performing a patterning and a deposition step, wherein the patterning is used for forming the magnetic tunnel junction (MTJ) cell, and the deposition step is for forming a dielectric cap layer covering the MTJ cell.

In embodiments, the step of etching the MTJ structure 28 for forming the MTJ cell 38 and the step of forming the dielectric cap layer 42 are in-situ formed in a same vacuum environment, with no vacuum break occurring between the step of etching MTJ structure 28 and the step of forming dielectric cap layer 42. The step of removing the hard mask feature 32, which step is performed after the patterning of top electrode layer 30 and MTJ structure 28, may also be performed in the same vacuum environment. FIG. 9 illustrates a production tool 100 for performing the step of etching MTJ structure 28 for forming the MTJ cell 38 and the step of forming dielectric cap layer 42. Production tool 100 includes loadlocks 110 for loading the MRAM device 10 into production tool 100, and remove the MRAM device 10 out of production tool 100. The production tool 100 further includes a plurality of etching chambers 102, which are used to etch different layers to form the top electrode 40, the MTJ cell 38, and the hard mask feature 32. The dielectric cap layer 42, for example, is formed in a chamber 104 which is connected to, and shares the same vacuum environment as, the etching chambers 102. Accordingly, no vacuum break occurs during, and between, the step of etching the MTJ structure 28 and the step of forming the dielectric cap layer 42, and the MRAM device 10 is not exposed to the external environment when transferred between chambers 102 and 104. Optionally, the step of etching the top electrode layer 30 to form the top electrode 40 may also be in-situ performed in production tool 100. Accordingly, in the respective embodiment, there is no vacuum break starting from the step of etching the electrode layer 30 to the step of forming the dielectric cap layer 42.

Figure 6:
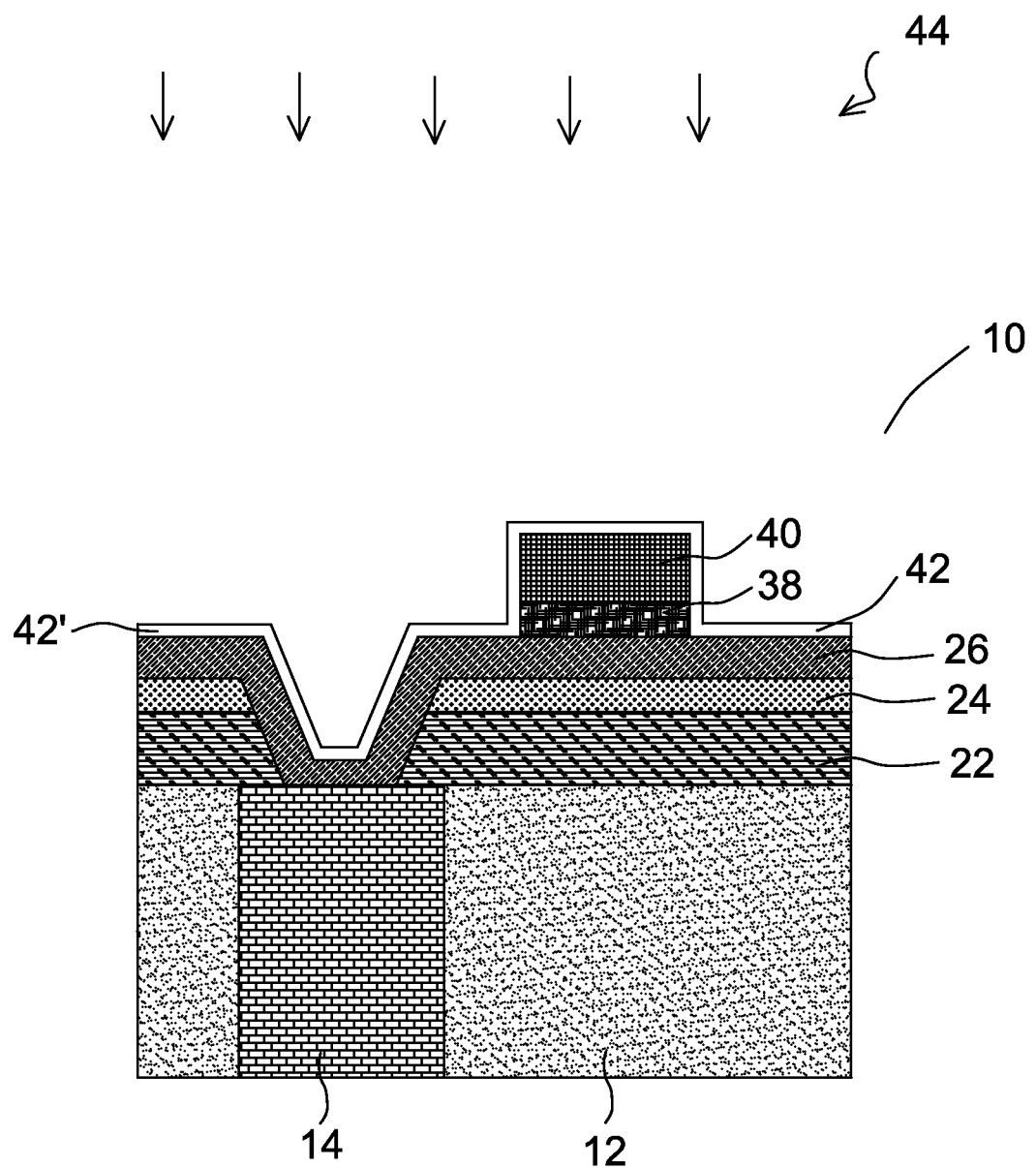

Next, as shown in FIG. 6, a treatment 44 is provided over the dielectric cap layer 42. In an embodiment, the treatment 44 is a plasma treatment using chemicals comprising $N_2$ and Ar gases. The flow rates of the $N_2$ and Ar gases, for example, are ranging from about 500 to about 1500 sccm and from about 100 sccm to about 500 sccm, respectively. In an embodiment, the treatment 44 is a plasma treatment without using gases containing oxygen or hydrogen because the species of oxygen and hydrogen may damage the free layer 28D and the tunnel barrier layer 28C, respectively. In an embodiment, the treatment 44 is a plasma treatment performed using a power ranging between about 1000 watts and about 2500 watts for a period of time ranging between about 10 seconds and about 40 seconds. The dielectric cap layer 42 is then transformed into a treated dielectric cap layer 42' by the treatment 44. In embodiments, the treatment 44 may produce N—H bonds to reduce dangling bonds on the treated surface, whereby the treated dielectric cap layer 42' has reduced dangling bonds compared with the dangling bonds on the dielectric cap layer 42 before the treatment 44. In an embodiment, the dielectric cap layer 42 is composed of SiN, the treatment 44 transforms the upper portion of the dielectric cap layer 42 from SiN into SiNH, but leaves the lower portion of the dielectric cap layer 42 unchanged and is still composed of SiN. In an alternative embodiment, the treatment 44 transforms the dielectric cap layer 42 into the treated dielectric cap layer 42' entirely composed of SiNH. The treated dielectric cap layer 42' has an improved film quality which may provide better protection to resist $H_2O$ or $O_2$ penetrating through, whereby the treated dielectric cap layer 42' may provide better protection to the MTJ cell 38 from degradation and therefore improve the performance of MRAM devices.

In embodiments, the treatment 44 is in-situ performed after the formation of dielectric cap layer 42 by sharing the same vacuum environment. In an embodiment, the treatment 44 is provided in the same chamber, e.g., in chamber 104, for forming the dielectric cap layer 42. Accordingly, there is no vacuum break between the formation of dielectric cap layer 42 and the treatment 44. In an alternative embodiment, the treatment 44 is provided in a chamber different from the chamber for forming the dielectric cap layer 42 (e.g., in chamber 106 rather than chamber 104). Since the MRAM device 10 is transferred from the chamber 104 to the chamber 106 in production tool 100 (FIG. 9), there is no vacuum break between the formation of dielectric cap layer 42 and the treatment 44. In an alternative embodiment, after the formation of dielectric cap layer 42, the MRAM device 10 is removed out of production tool 100, and is sent to another chamber (not shown) for the treatment 44. Accordingly, there is a vacuum break between the formation of dielectric cap layer 42 and the treatment 44.

Figure 7:
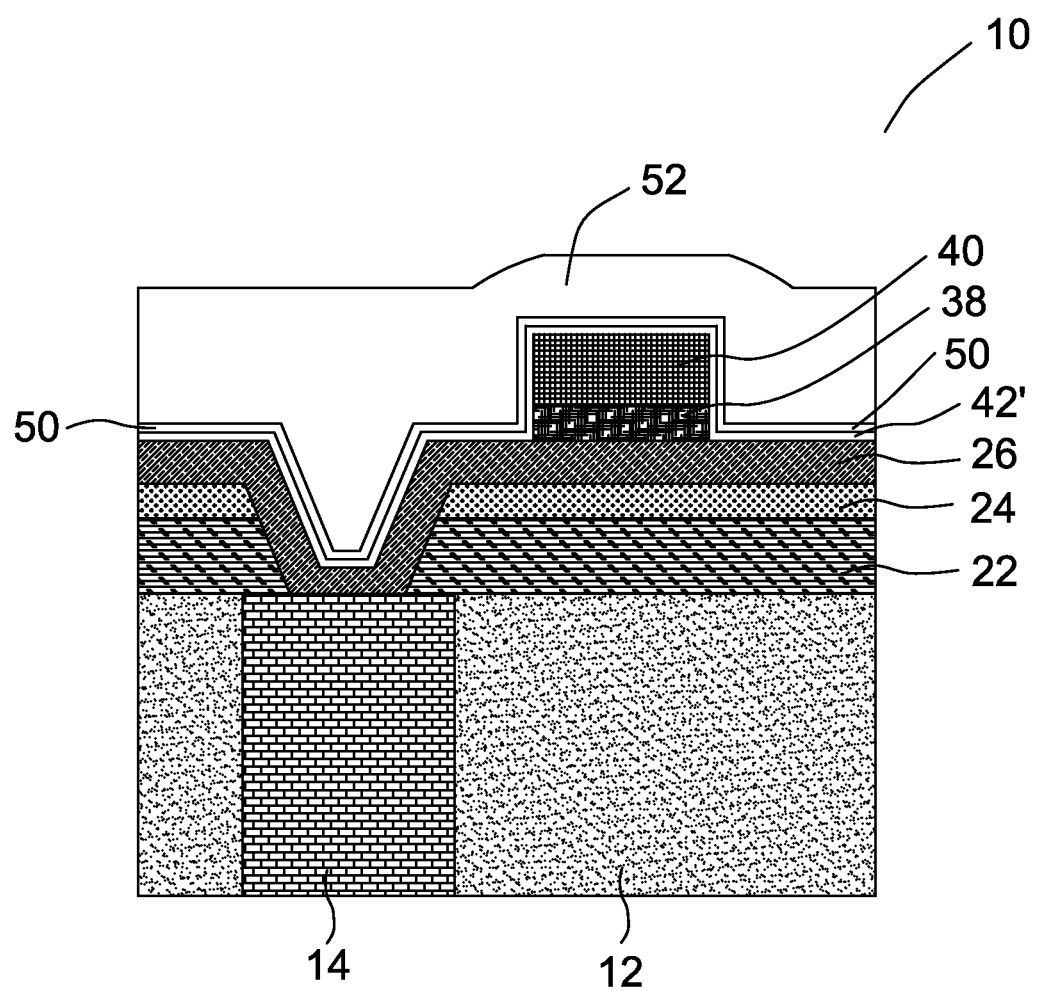
Figure 8:
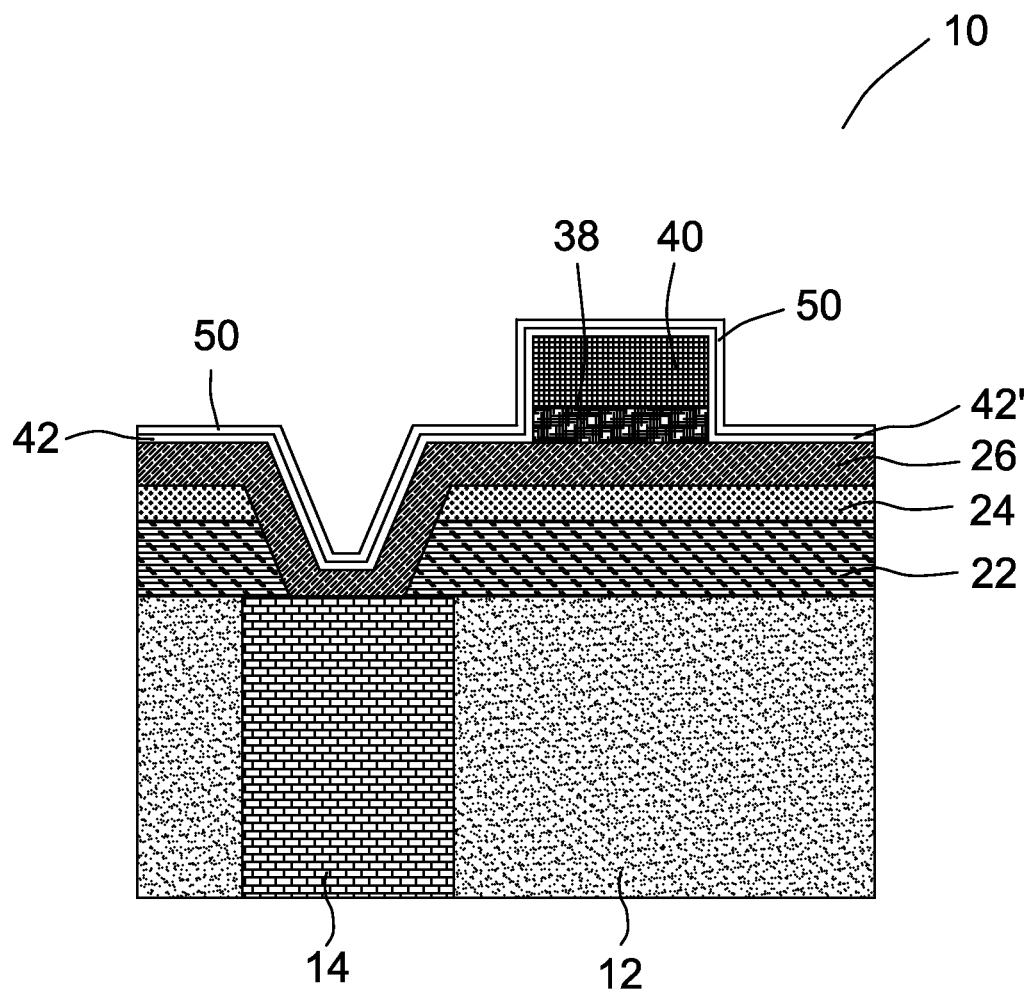

FIGS. 7 and 8 illustrate the formation of features that are over the treated dielectric cap layer 42'. Referring to FIG. 7, a dielectric layer 50 is formed over, and may contact, the treated dielectric cap layer 42'. In an embodiment, the dielectric layer 50 is an oxide layer, which may further be a silicon oxide layer. Next, a BARC layer 52 is formed over the dielectric layer 50, wherein the BARC layer 52 may be formed of silicon oxynitride, for example.

As shown FIG. 8, an etch step is performed to etch the portions of the BARC layer 52, the dielectric layer 50, and the treated dielectric cap layer 42', until the top electrode 40 is exposed. Next, the BARC layer 52 is removed, while the dielectric layer 50 and the treated dielectric cap layer 42' may remain un-removed. In subsequent steps, additional layers such as a tantalum nitride layer (not shown) may be formed over, and possibly contacting, the dielectric layer 50, the top electrode 40, and the top edge of the treated dielectric cap layer 42'.

In the embodiments, the treatment 44 may transform the dielectric cap layer 42 into the treated dielectric cap layer 42' with an improved film quality. Therefore, the treated dielectric cap layer 42' may protect the MTJ cell 38 from moisture, oxygen, and the etching gases that are used in the subsequent process steps. Therefore, the treated dielectric cap layer 42' may provide significant better protection on the device in accordance with embodiments.

In accordance with embodiments, a method includes patterning a plurality of magnetic tunnel junction (MTJ) layers to form an MTJ cell, forming a dielectric cap layer over a top surface and on a sidewall of the MTJ cell, performing a treatment to transform the dielectric cap layer into a treated dielectric cap layer, and forming a dielectric layer over the treated dielectric cap layer. The treatment comprises a nitrogen-containing gas.

In accordance with other embodiments, a method includes providing a substrate with a plurality of magnetic tunnel junction (MTJ) layers, patterning the plurality of magnetic tunnel junction (MTJ) layers to form an MTJ cell, forming a silicon nitride layer over a top surface and on a sidewall of the MTJ cell, and performing a plasma treatment on the silicon nitride layer using a gas comprising $N_2$. The silicon nitride layer has a density greater than about 2.4 $g/cm^3$.

In accordance with yet other embodiments, a device includes a magnetic tunnel junction (MTJ) cell, a dielectric cap layer in physical contact with a sidewall of the MTJ cell, and a dielectric layer over and contacting a top surface and a sidewall of the dielectric cap layer. The dielectric cap layer has a density greater than about 2.4 $g/cm^3$.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    patterning a plurality of magnetic tunnel junction (MTJ) layers to form an MTJ cell;
    forming a dielectric cap layer on a top surface and on a sidewall of the MTJ cell;
    performing a treatment to transform the dielectric cap layer into a treated dielectric cap layer, wherein the treatment comprises a nitrogen-containing gas, and the treatment is configured to produce one or more nitrogen-hydrogen bonds on a treated surface; and
    forming a dielectric layer over the treated dielectric cap layer.

2. The method of claim 1, wherein the dielectric cap layer is silicon nitride.

3. The method of claim 1, wherein the treatment is a plasma treatment performed with a gas comprising $N_2$.

4. The method of claim 1, wherein the nitrogen-containing gas does not contain oxygen or hydrogen.

5. The method of claim 1, wherein the dielectric cap layer is formed by radical shower chemical vapor deposition (RSCVD) with a deposition rate less than or equal to about 4.5 Å/sec.

6. The method of claim 1, wherein the dielectric cap layer is formed at a temperature ranging between about 200° C. and about 300° C.

7. The method of claim 1, wherein the step of forming the dielectric cap layer and the step of performing the treatment are formed in a radical shower chemical vapor deposition (RSCVD) apparatus, and there is no vacuum break between the step of forming the dielectric cap layer and the step of performing the treatment.

8. The method of claim 1 further comprising:
    forming a top electrode layer over the MTJ cell;
    patterning the top electrode layer to form a top electrode, wherein the top electrode layer and the MTJ layers are patterned using a same mask and wherein the top electrode is under the treated dielectric cap layer; and
    etching the dielectric layer and the treated dielectric cap layer to expose the top electrode.

9. The method of claim 1, wherein the treatment transforms at least a top portion of the dielectric cap layer from SiN into SiNH.

10. A method for forming a magnetoresistive random access memory (MRAM) device, comprising:
   providing a substrate with a plurality of magnetic tunnel junction (MTJ) layers;
   patterning the plurality of magnetic tunnel junction (MTJ) layers to form an MTJ cell;
   forming a silicon nitride layer on a top surface and on a sidewall of the MTJ cell, wherein the silicon nitride layer has a density greater than about 2.4 g/cm$^3$; and
   performing a plasma treatment on the silicon nitride layer using a gas comprising $N_2$.

11. The method of claim 10, wherein the plasma treatment further comprises Ar gas.

12. The method of claim 10, wherein the silicon nitride layer is formed at a temperature ranging between about 200° C. and about 300° C. in a radical shower chemical vapor deposition (RSCVD) apparatus.

13. The method of claim 10, wherein the silicon nitride layer is formed with a deposition rate less than or equal to about 4.5 Å/sec.

14. The method of claim 11, wherein the plasma treatment is in-situ performed in a radical shower chemical vapor deposition (RSCVD) apparatus.

15. The method of claim 10 further comprising:
   forming an oxide layer over the treated silicon nitride layer.

16. The method of claim 15 further comprising:
   forming a top electrode layer over the MTJ cell;
   patterning the top electrode layer to form a top electrode, wherein the top electrode layer and the MTJ layers are patterned using a same mask and wherein the top electrode is under the treated silicon nitride layer; and
   etching the oxide layer and the treated silicon nitride layer to expose the top electrode.

17. The method of claim 10, wherein the plasma treatment is performed with a power ranging between about 1000 watts and about 2500 watts for a period of time ranging between about 10 seconds and about 40 seconds.

18. A method comprising:
   patterning a plurality of magnetic tunnel junction (MTJ) layers to form an MTJ cell;
   forming a dielectric cap layer on a top surface and on a sidewall of the MTJ cell; and
   performing a plasma treatment to transform the dielectric cap layer into a treated dielectric cap layer, wherein the plasma treatment comprises using a nitrogen-containing gas.

19. The method of claim 18, wherein the nitrogen-containing gas does not contain oxygen or hydrogen.

20. The method of claim 18, wherein the plasma treatment transforms at least a top portion of the dielectric cap layer from SiN into SiNH.

* * * * *